(12) United States Patent
Bao

(10) Patent No.: US 9,019,037 B2
(45) Date of Patent: Apr. 28, 2015

(54) SIX-PORT CIRCUIT

(75) Inventor: Mingquan Bao, Vastra Frolunda (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 246 days.

(21) Appl. No.: 13/825,764

(22) PCT Filed: Sep. 24, 2010

(86) PCT No.: PCT/EP2010/064113
§ 371 (c)(1),
(2), (4) Date: Mar. 22, 2013

(87) PCT Pub. No.: WO2012/037980
PCT Pub. Date: Mar. 29, 2012

(65) Prior Publication Data
US 2013/0176084 A1  Jul. 11, 2013

(51) Int. Cl.
*H01P 5/12* (2006.01)
*H03H 7/42* (2006.01)
*H04B 1/30* (2006.01)
*H03H 7/21* (2006.01)
*H03H 7/06* (2006.01)
*H03H 7/19* (2006.01)

(52) U.S. Cl.
CPC . *H03H 7/42* (2013.01); *H04B 1/30* (2013.01); *H03H 7/06* (2013.01); *H03H 7/19* (2013.01); *H03H 7/21* (2013.01)

(58) Field of Classification Search
USPC .............. 333/126–129, 132, 134, 136, 25, 26
See application file for complete search history.

(56) References Cited

U.S. PATENT DOCUMENTS

2004/0101067 A1   5/2004   Abe et al.

OTHER PUBLICATIONS

Zhao et al. "Millimeter-wave Passive Components on Silicon for Wireless Communicaton Applications" Electronics, Circuits, and Systems, Dec. 13, 2009, 16th IEEE International Conference, pp. 972-875, XP031626245.

*Primary Examiner* — Robert Pascal
*Assistant Examiner* — Kimberly Glenn
(74) *Attorney, Agent, or Firm* — Rothwell, Figg, Ernst & Manbeck, P.C.

(57) ABSTRACT

A six-port circuit (100) with two input ports and four output ports, comprising a balun (110) for converting signals at one input port into first (112) and second (113) balanced signals, and a filter (105), with first and second input ports and four output ports as the four output ports of the circuit. The six-port circuit also comprises a splitter (120) for splitting second input signals at the other input port into first (121) and second (122) parts. The input ports ($V'_{in1}$, $V'_{in2}$) of the filter (105) are connected so that one of the balanced signals (112) and one of the parts (121) of the second input signals are connected to one of the filter's input ports ($V'_{in1}$), and the other of the balanced signals (113) and the other (122) of the parts of the second input signals are connected to the other of the filter's input ports ($V'_{in2}$).

5 Claims, 6 Drawing Sheets

SIX-PORT CIRCUIT

CROSS REFERENCE TO RELATED APPLICATION(S)

This application is a 35 U.S.C. §371 National Phase Entry Application from PCT/EP2010/064,113, filed Sep. 24, 2010, designating the United States, the disclosure of which is incorporated herein in its entirety by reference.

TECHNICAL FIELD

The present invention discloses a novel six-port circuit.

BACKGROUND

A six-port circuit is a kind of circuit which is often used in, for example, wireless communication systems, particularly in the microwave range. A six-port circuit has two input ports and four output ports, and produces at each of its four output ports a signal which is a composite of the signals applied at the input ports, in which composite signal the phase difference between the input signals comprised in the composite signal differs between the output ports. Usually, the phase difference varies in "steps" of 90 degrees, so that at the four output ports, the following phase differences between the signals applied at the input ports at output ports can be accessed or obtained: 0 degrees, 90 degrees, 180 degrees and 270 degrees.

A conventional six-port circuit comprises a number of so called Wilkinson power splitters and 90 degree hybrid couplers, which leads to a large circuit which needs to be implemented as, for example, microstrip or strip line solutions on a substrate.

SUMMARY

It is an object of the present invention to present a six-port circuit which obviates at least some of the disadvantages of previously known six-port circuits.

This object is achieved by the present invention in that it discloses a six-port circuit with first and second input ports and four output ports. The six-port circuit comprises a balun with its unbalanced end connected to the first input port for converting a first input signal at the first input port into first and second balanced input signals. The six-port circuit also comprises a filter which is a quadrature all-pass filter or a polyphase filter with first and second input ports and four output ports which constitute the four output ports of the six-port circuit.

In addition, the six-port circuit also comprises a power splitter connected to the second input port for splitting a second input signal at the second input port into a first and a second part of the second input signals. In the six-port circuit, the two input ports of the filter are connected so that one of the balanced input signals and one of the parts of the second input signals are connected to one of the filter's input ports, and the other of the balanced input signals and the other of the parts of the second input signals are connected to the other of the filter's input ports.

In one embodiment of the six-port circuit, the filter is a quadrature all-pass filter in which a first and a second of the filter's output ports are connected to each other by means of a resistor, as are a third and a fourth of the filter's output ports, and the first and fourth of the filter's output ports are connected to the filter's first and second input ports, respectively, by means of a first reactive component of a first kind, and the filter's first input port is connected to the filter's third output port by means of a first component of a second reactive kind, and the filter's second input port is connected to the filter's second output port by means of a second reactive component of the second kind.

In one embodiment of the six-port circuit with a quadrature all-pass filter, the reactive components of the first and second kind are chosen as either capacitors or inductors, so that the reactive components of the first and second kind are chosen as different kinds of reactive components.

In one embodiment of the six-port circuit, the filter is a polyphase filter which comprises four resistors and four reactive components of a first kind, where the resistors and reactive components of the first kind are connected in series to each other, serially "interleaved", so that a resistor is connected serially to a reactive component of the first kind. In the polyphase filter, each of the four output ports is accessed at a point between a serially connected resistor and a reactive component of the first kinds. The serially connected components of the polyphase filter are serially connected in a "loop", with the first input port of the polyphase being at a point between the "first" and the "last" component in the loop, and the second input port of the polyphase filter being at a point between the second component of the reactive component of the first kind and the third resistor.

BRIEF DESCRIPTION OF THE DRAWINGS

The invention will be described in more detail in the following, with reference to the appended drawings, in which.

DETAILED DESCRIPTION

Figure 1:
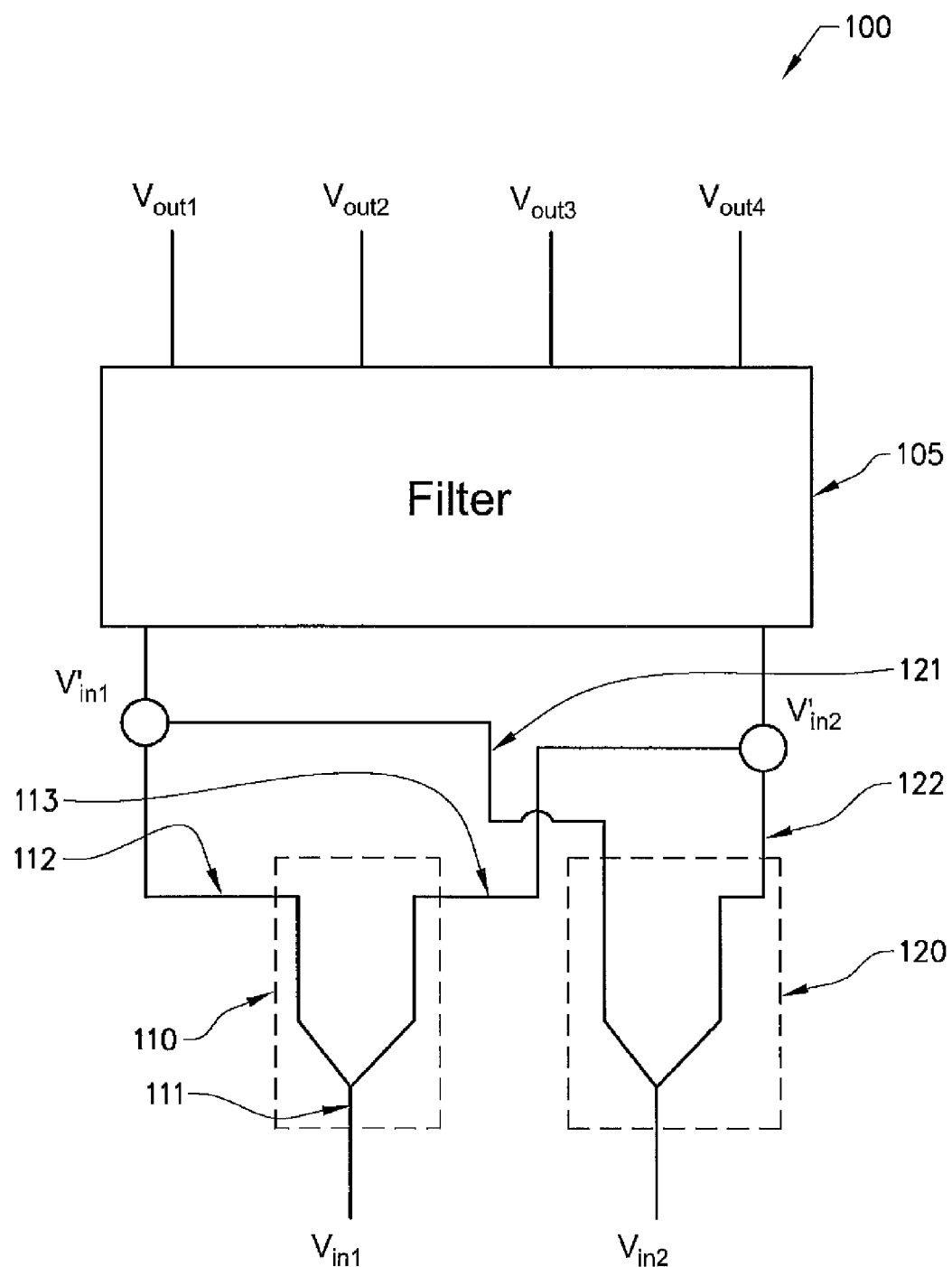
FIG. 1 shows a first embodiment of the invention.

Embodiments of the present invention will be described more fully hereinafter with reference to the accompanying drawings, in which embodiments of the invention are shown. The invention may, however, be embodied in many different forms and should not be construed as being limited to the embodiments set forth herein. Like numbers in the drawings refer to like elements throughout.

The terminology used in this text is for the purpose of describing particular embodiments only, and should not be used to limit the scope of the invention.

FIG. 1 shows a first embodiment 100 of a six-port circuit of the invention. As shown in FIG. 1, the embodiment 100 comprises a first $V_{in1}$ and a second $V_{in2}$ input port. In addition, the embodiment 100 also comprises four output ports, shown as $V_{out1}$, $V_{out2}$, $V_{out3}$ and $V_{out4}$.

As is also shown in FIG. 1, the embodiment 100 comprises a balun 110 which is connected with its unbalanced end 111 to the first input port $V_{in1}$ of the six-port circuit 100, so that signals which are supplied to the first input port ("first input signals") are converted into a first 112 and a second 113 balanced input signal at the balanced ports of the balun 110.

In addition, the embodiment 100 also comprises a power splitter 120, which is connected to the second input port $V_{in2}$ of the six-port circuit 100, for splitting signals which are supplied to the second input port ("second input signals") into a first 121 and second parts 122. The splitting is preferably equal, i.e. 50% of the input signal to each of the parts 121, 122, although other divisions are also possible.

The six-port circuit 100 also comprises a filter 105, which can be either a quadrature all-pass filter or a polyphase filter. Detailed examples of such filters will be given later in this text.

As shown in FIG. 1, the filter 105 comprises first, $V'_{in1}$, and second, $V'_{in2}$ input ports, as well as four output ports which constitute the output ports $V_{out1}$, $V_{out2}$, $V_{out3}$, $V_{out4}$, of the six-port circuit 100.

The balanced ports of the balun 110 are connected so that one each of the first 112 and second 113 balanced input signals from the balun 110 is connected to one of the first, $V'_{in1}$, and second, $V'_{in2}$ input ports, of the filter 105.

FIG. 1 shows that the balanced signal 112 of the balun 110 is connected to the first, $V'_{in1}$, input port of the filter 105, while the other balanced signal 113 of the balun 110 is connected to the second, $V'_{in2}$, input port of the filter 105. In addition, the power splitter 120 is connected so that one of the parts 121, of the second input signal is connected to the first, $V'_{in1}$, input port of the filter 105, while the other of the parts 122, of the second input signal is connected to the second, $V'_{in2}$, input port of the filter 105. Thus, at each of the input ports $V'_{in1}$, $V'_{in2}$, of the filter 105, there is one of the balanced input signals from the balun 110 and one of the output signals from the power splitter 120, i.e. one of the two parts of the second input signal.

The power splitter 120 splits the second input signal into two parts which have the same phase, while the balun 110 delivers two balanced output signals 112, 113 with a 180 degree phase difference between them. Due to this, and also due to how the balun 110 and the power splitter 120 are connected to the filter 105, as well as to the design of the filter 105, as a quadrature all pass filter or a polyphase filter, it will be possible to access output signals of the six-port circuit 100 at the four output ports $V_{out1}$-$V_{out4}$. The output signals at the four output ports $V_{out1}$-$V_{out4}$ will really be one composite signal with different phase: the composite signal will be a signal which is a composite of the signals which are input at the first and second input ports, and the phase difference between the signals which are input at the first and second input ports will differ between the four output ports, i.e. in the composite signal which can be accessed at those ports. The amplitudes of the signal at the different output ports may differ from each other.

Using the notations of FIG. 1, the output signal at the output ports denoted in FIG. 1 as $V_{out1}$, $V_{out2}$, $V_{out3}$, $V_{out4}$, will have respective phase differences between the input signals comprised in the composite signal of 0, 90, 270 and 180 degrees. Accordingly, if, for example, in a communications system, a radio signal is received at an RF (Radio Frequency) frequency and the RF signal is used as input to the power splitter 120, i.e. as $V_{in2}$, and a signal from a Local Oscillator at frequency $F_{LO}$ is used as the input to the balun 110, i.e. connected to $V_{in1}$, the six-port circuit 100 will deliver as its output at each of the four output ports a composite signal of the RF and the LO signals, with a different phase difference between the RF and LO signals at each of the four output ports. The phase differences between the four output ports will here be in steps of 90 degrees, which is useful in applications such as so called I-Q receivers.

Figure 2:
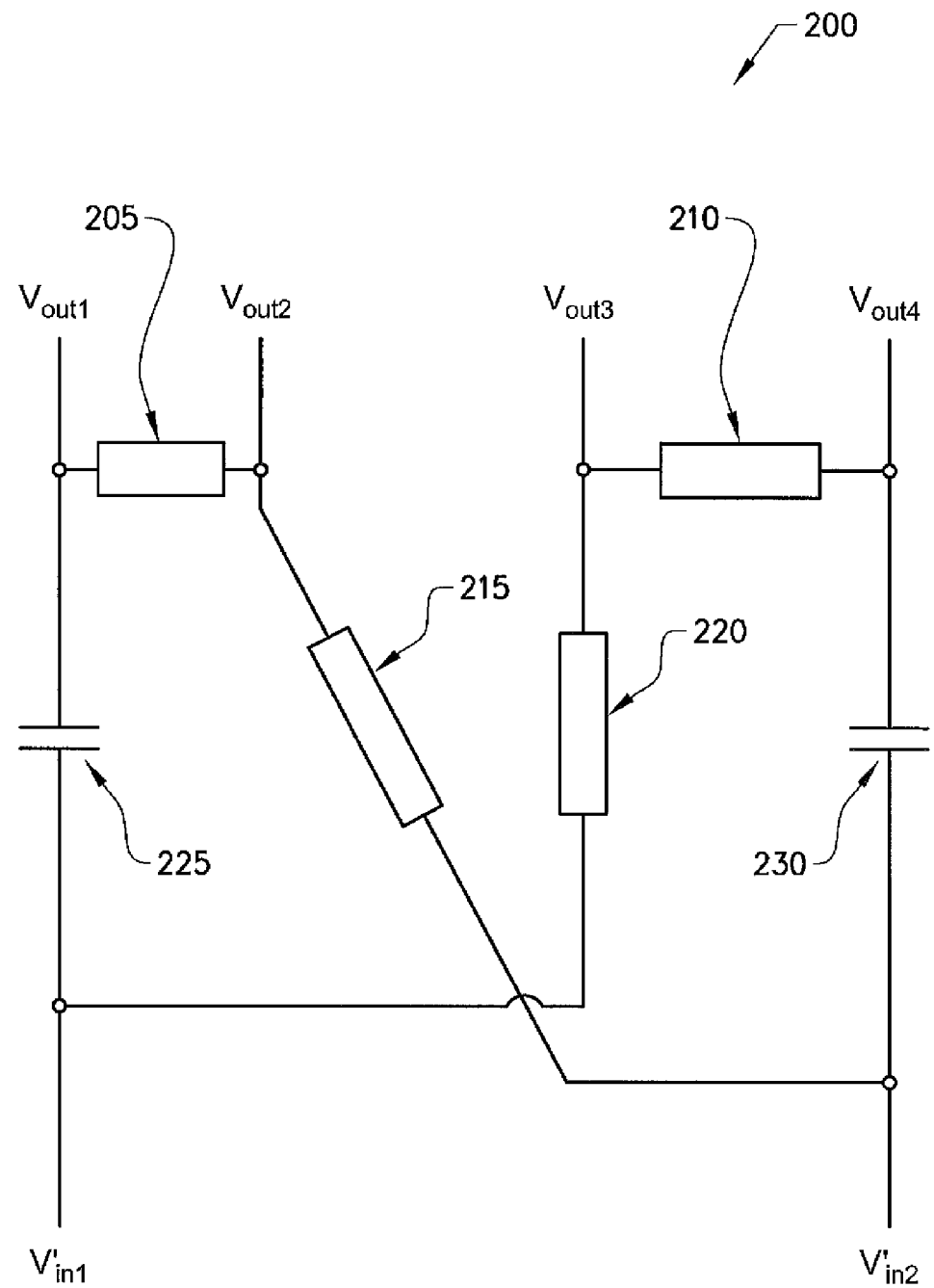
FIGS. 2 and 3 show different embodiments of filters for use in the invention.

Turning now to the nature of the filter 105, an example of a first embodiment is given in FIG. 2, which shows a generic so called quadrature filter 200: as shown in FIG. 2, the quadrature filter 200 comprises the four output ports shown in FIG. 1, $V_{OUT1}$-$V_{OUT4}$, as well as the two input ports $V'_{in1}$ and $V'_{in2}$ shown in FIG. 1. The output ports of the filter 200 have been given the same references as the output ports of the six-port circuit 100 of FIG. 1, since the output ports of the filter serve as the output ports of the six-port circuit 100. A first, $V_{OUT1}$ and a second $V_{OUT2}$, of the filter's 200 output ports are connected to each other by means of a first resistor 205, and a third $V_{OUT3}$ and a fourth $V_{OUT4}$ of the filter's 200 output ports are also connected to each other by means of a second resistor 210, where the resistors 205 and 210 are suitably of the same value, i.e. equal resistances.

As is also shown in FIG. 2, the first, $V_{OUT1}$, of the filter's 200 output ports is connected to the filter's first input port $V'_{in1}$ by means of a first reactive component of a first kind, in the example shown a capacitance 225, and the fourth output port, $V_{OUT4}$, of the filter 200 is connected to the filter's second input port $V'_{in2}$ by means of a second reactive component of the first kind, in the example shown a capacitance 230. Suitably, the first 225 and second 230 capacitances are of the same magnitude, i.e. equal capacitances.

Finally, as can also be seen in FIG. 2, the filter's 200 first input port $V'_{in1}$ is connected to the filter's third output port, $V_{OUT3}$, by means of a first reactive component 220 of a second kind, and the filter's 200 second input port $V'_{in2}$, is connected to the filter's second output port, $V_{OUT2}$, by means of a second reactive component 215 of the second kind. Suitably, the first 220 and second 215 reactive components of the second kind are of the same magnitude.

Regarding the reactive components of the first and second kinds mentioned above and shown in FIG. 2 the following can be said: the reactive components are either inductances or capacitances, so that if the reactive components of the first kind are chosen to be inductances, the reactive components of the second kind will be chosen to be capacitances, and vice versa.

Figure 3:
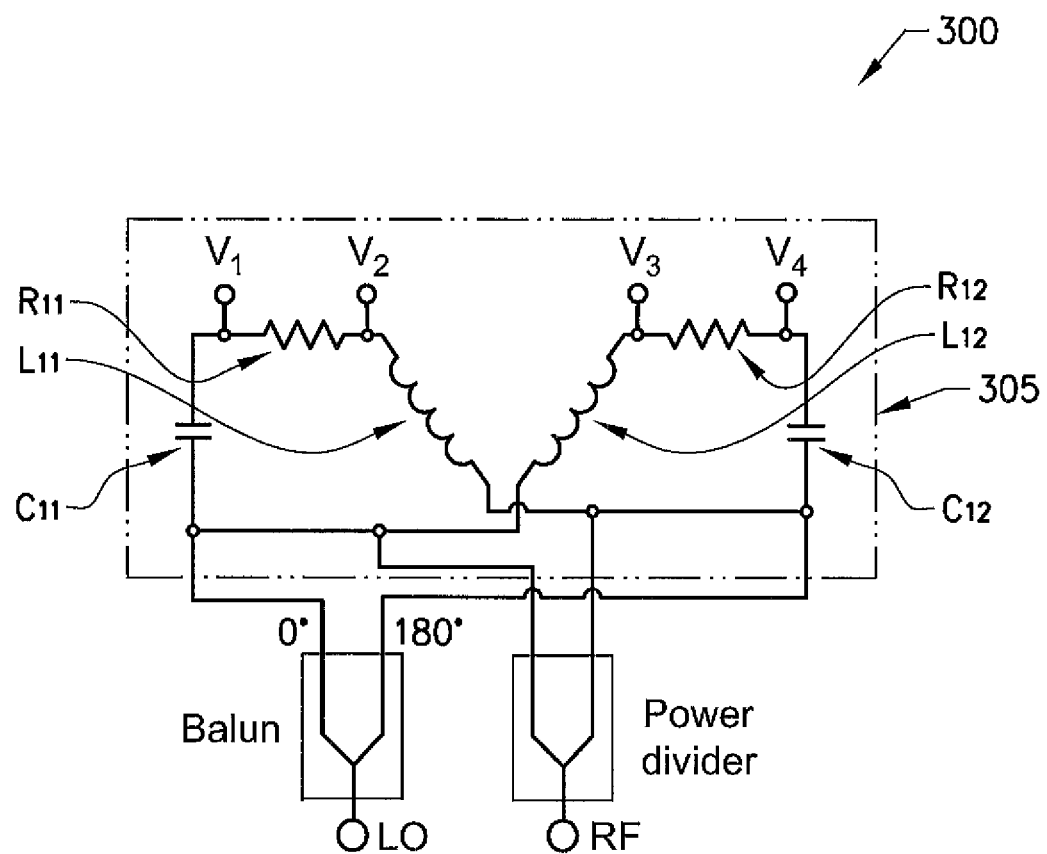

FIG. 3 shows an example of a six-port circuit 300 in which a particular embodiment of an all-pass quadrature filter 305 is used. In this filter 305, the reactive components of the first kind are chosen to be capacitors $C_{11}$ and $C_{12}$, of equal value, i.e. equal capacitances, and the reactive components of the second kind are chosen to be inductors $L_{11}$ and $L_{12}$ of equal value, i.e. equal inductances. The first and second resistors of FIG. 2 are here shown as being two resistors $R_{11}$ and $R_{12}$, also of equal resistances.

Figure 4A:
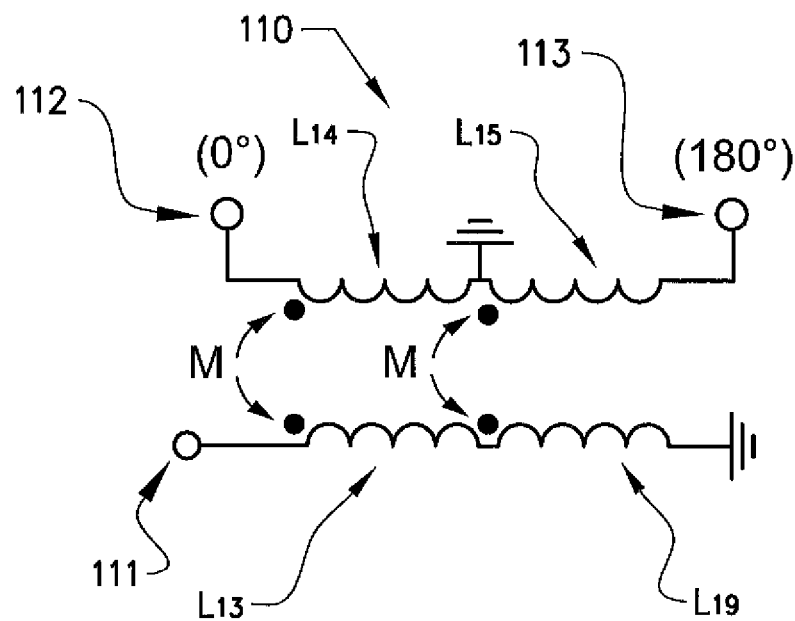
FIGS. 4a and 4b show a balun and a power splitter used in the invention.
Figure 4B:
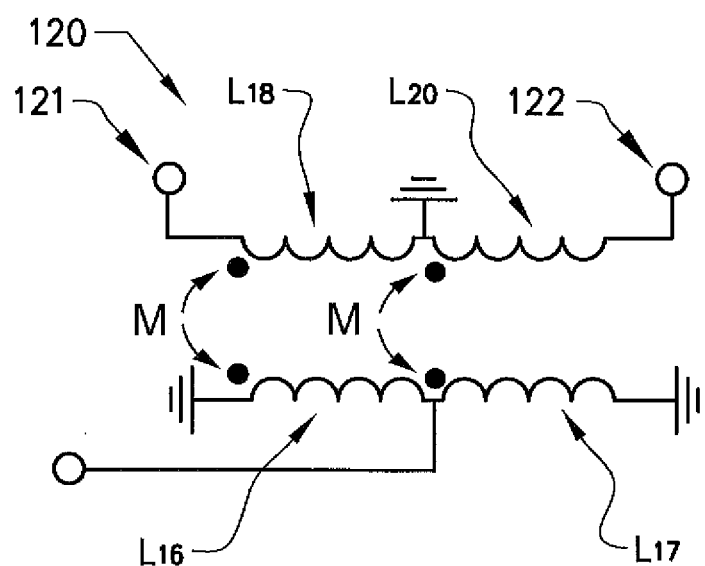

FIG. 4a shows an example of the balun 110 for use in the invention, and FIG. 4b shows an example of the power splitter 120 for use in the invention: the unbalanced side of the balun 110, as shown in FIG. 4a, comprises a first $L_{13}$ inductor connected in series with a second inductor $L_{19}$, and the inductors on the unbalanced side are coupled inductively to the balanced side which in turn comprises two other inductors $L_{14}$ and $L_{15}$. Inductors $L_{14}$ and $L_{15}$ are connected serially to each other, and are grounded at their connecting point. The coupling between the balanced and unbalanced sides of the balun 110 is indicated by means of "the dot convention", and by means of the letter "M", where "M" represents mutual inductance. As is also indicated in FIG. 4a, the signals 112, 113, at the output ports of the balun 110 have phase positions of 0 and 180 degrees, i.e. there is a phase difference of 180 degrees between them.

The power splitter 120 shown in FIG. 4b also comprises first $L_{16}$ and second $L_{17}$ inductors connected serially to each other on the "input side", where an input signal is connectable at a point between the two inductors $L_{16}$ and $L_{17}$. On the "output side" of the power splitter 120, there are third and fourth inductors $L_{18}$ and $L_{20}$ connected serially to each other via a grounding point between them. The third and fourth inductors $L_{18}$ and $L_{20}$ are coupled inductively to the first and second inductors $L_{16}$ and $L_{17}$, respectively as indicated in FIG. 4b by means of "the dot convention" and by the letter "M", where "M" represents mutual inductance.

Regarding the values of the inductors in FIGS. 4a and 4b, the following can be said: $L_{14}$ should be equal to $L_{15}$, $L_{13}$ should be equal to $L_{19}$, and $L_{18}$ should be equal to $L_{20}$ and $L_{16}$ should be equal to $L_{17}$.

Figure 5:
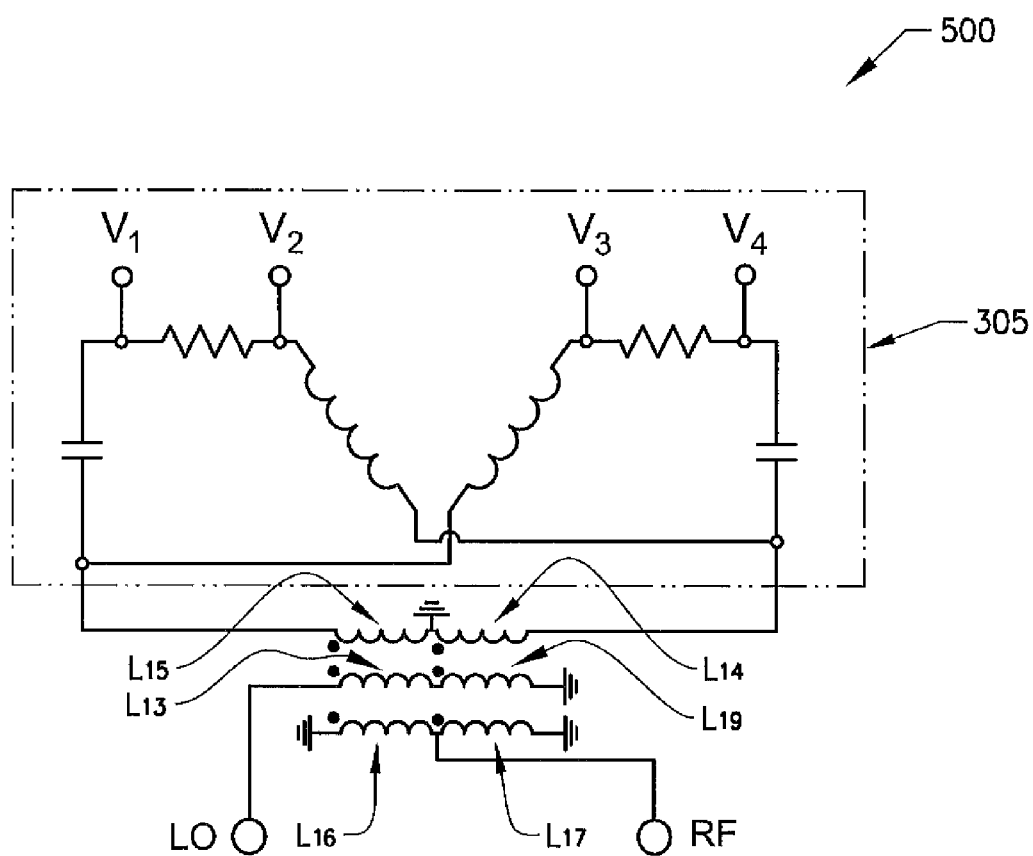
FIG. 5 shows a six-port circuit using the balun and power splitter of FIGS. 4a and 4b.

FIG. 5 shows a six-port circuit 500 of the invention in one embodiment, using the balun 110 and the power splitter 120 of FIGS. 4a and 4b together with the filter 305 of FIG. 3. The notations from FIGS. 4a and 4b have been used here as well. The unbalanced side of the balun 110 is used for inputting an LO signal, and the "input" side of the power splitter of 120 is used for inputting an RF signal. Since, as can also be seen in FIGS. 4a and 4b, the balanced side of the balun 110 and the "output" side of the power splitter 120 have a similar structure, they share the output side (which is used as "input" to the filter 305) by means of the serially connected inductors $L_{14}$ and $L_{15}$, which have a grounding point in between them. The values of the inductors which are indicated above should be applied here as well.

The outputs $V_{out1}$, $V_{out2}$, $V_{out3}$, $V_{out4}$ of the six-port circuit 200 will now be derived, in order to further explain the function of the circuit 100. In the example below, we will use an LO signal at amplitude $V_{LO}$ and frequency $F_{LO}$ as input to the balun 110, and an RF signal with amplitude $V_{RF}$ and frequency $F_{RF}$ as input to the power splitter 120. The reactive components 225, 230, of the first kind will be assumed to be capacitors with the magnitude C, and the reactive components 215, 220, of the second kind will be assumed to be inductors with the magnitude L. However, those skilled in the art will realize that the first kind of reactive component can equally well be coils, if the second kind of reactive component is chosen to be capacitances. The resistors 205, 210 are assumed to have the magnitude R. If there is only the RF signal as input to the circuit 200, i.e. at the power splitter 120, and we use $V_{OUTiR}$ to denote the output signal at output port i, where i=1, 2, 3, 4, we get:

$$V_{OUT1R}=V_{OUT2R}=V_{OUT3R}=V_{OUT4R}=V_{RF} \quad (1)$$

where $V_{RF}$ is used to denote the signal which is one and the same at all of the four output ports.

Conversely, if there is only the LO signal as input to circuit 200, i.e. to the balun 110, and we use $V_{outiLO}$ to denote the output signal at output port i, where i=1, 2, 3, 4, and where $V_{LO}$ is the input LO-signal, we get:

$$V_{out1LO} = \frac{R - \frac{1}{j\omega C} + j\omega L}{R + \frac{1}{j\omega C} + j\omega L} \cdot V_{LO} \quad (2)$$

$$V_{out2LO} = \frac{-R - \frac{1}{j\omega C} + j\omega L}{R + \frac{1}{j\omega C} + j\omega L} \cdot V_{LO} \quad (3)$$

$$V_{out3LO} = -\frac{-R - \frac{1}{j\omega C} + j\omega L}{R + \frac{1}{j\omega C} + j\omega L} \cdot V_{LO} \quad (4)$$

$$V_{out4LO} = -\frac{R - \frac{1}{j\omega C} + j\omega L}{R + \frac{1}{j\omega C} + j\omega L} \cdot V_{LO} \quad (5)$$

Also the composite signals $V_{out1} \ldots V_{out4}$, as shown in FIG. 2, are given by $V_{outi}=V_{OUTiRF}+V_{OUTiLO}$, where i=1, 2, 3, 4, of equations (1)-(5) above, which gives us:

$$V_{out1} = V_{RF} + \frac{R - \frac{1}{j\omega C} + j\omega L}{R + \frac{1}{j\omega C} + j\omega L} \cdot V_{LO} \quad (6)$$

$$V_{out2} = V_{RF} + \frac{-R - \frac{1}{j\omega C} + j\omega L}{R + \frac{1}{j\omega C} + j\omega L} \cdot V_{LO} \quad (7)$$

$$V_{out3} = V_{RF} - \frac{-R - \frac{1}{j\omega C} + j\omega L}{R + \frac{1}{j\omega C} + j\omega L} \cdot V_{LO} \quad (8)$$

$$V_{out4} = V_{RF} - \frac{R - \frac{1}{j\omega C} + j\omega L}{R + \frac{1}{j\omega C} + j\omega L} \cdot V_{LO} \quad (9)$$

If $\omega C = \frac{1}{\omega L}$, $\quad (10)$ and $$R = 2\omega L \quad (11)$$

where $\omega$ is an angle frequency which is common for both the RF and the LO signals.

Inserting (10) and (11) above into (6)-(9) above, we get:

$$V_{out1}=V_{RF}+(1+j)\cdot V_{LO} \quad (12)$$

$$V_{out2}=V_{RF}+(-1+j)\cdot V_{LO} \quad (13)$$

$$V_{out3}=V_{RF}-(1+j)\cdot V_{LO} \quad (14)$$

$$V_{out4}=V_{RF}-(1+j)\cdot V_{LO} \quad (15)$$

From equations (12)-(15), and writing $V_{RF}$ as $V_{RF}=I_{RF}+jQ_{RF}$, we obtain the square of the amplitudes of $|V_{out1}|^2$, $|V_{out2}|^2$, $|V_{out3}|^2$, and $|V_{out4}|^2$ as:

$$|V_{out1}|^2=I_{RF}^2+Q_{RF}^2+2I_{RF}|V_{LO}|+2Q_{RF}|V_{LO}| \quad (16)$$

$$|V_{out2}|^2=I_{RF}^2+Q_{RF}^2-2I_{RF}|V_{LO}|+2Q_{RF}|V_{LO}| \quad (17)$$

$$|V_{out3}|^2=I_{RF}^2+Q_{RF}^2-2I_{RF}|V_{LO}|-2Q_{RF}|V_{LO}| \quad (18)$$

$$|V_{out4}|^2=I_{RF}^2+Q_{RF}^2-2I_{RF}|V_{LO}|-2Q_{RF}|V_{LO}| \quad (19)$$

And, from equations (16)-(19), we obtain:

$$|V_{out1}|^2-|V_{out4}|^2=4|V_{Lo}|\cdot(I_{RF}+Q_{RF}) \quad (20)$$

$$|V_{out2}|^2-|V_{out3}|^2=4|V_L|\cdot(-I_{RF}+Q_{RF}) \quad (21)$$

Thus, we can derive the I and Q components of the RF signal, $I_{RF}$ and $Q_{RF}$, from the differences of the square of the amplitudes, as follows:

$$I_{RF} = \frac{|V_{out1}|^2 - |V_{out4}|^2 - |V_{out2}|^2 + |V_{out3}|^2}{8|V_{LO}|} \quad (22)$$

$$Q_{RF} = \frac{|V_{out1}|^2 - |V_{out4}|^2 + |V_{out2}|^2 - |V_{out3}|^2}{8|V_{LO}|} \quad (23)$$

It should be pointed out that the signals $V_{RF}$ and $V_{LO}$ used above signifies the "complete signal", i.e. a signal which has both amplitude and phase.

Figure 6:
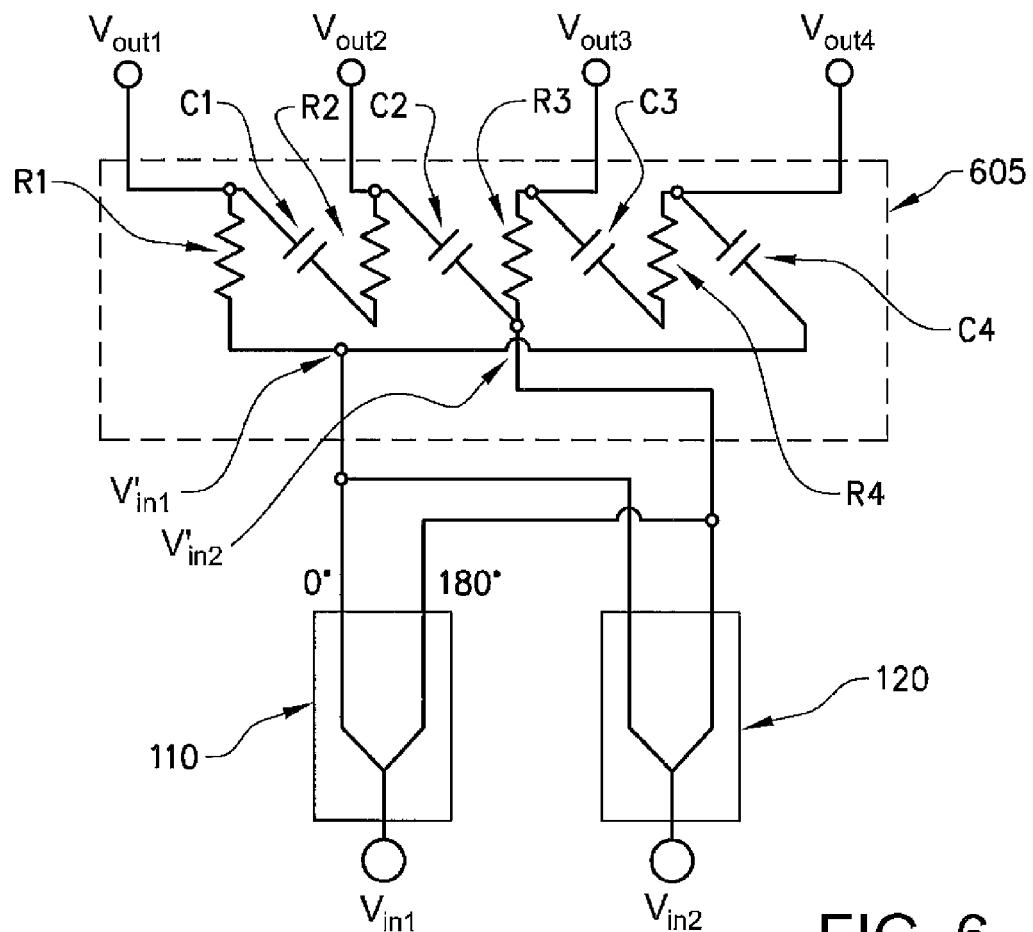
FIG. 6 shows a six-port circuit with another filter design.

FIG. 6 shows another embodiment 600 of a six-port circuit of the invention: as shown, the generic filter 105 of FIG. 1 has here been replaced with a so-called polyphase filter 605. As can be seen, the polyphase filter 605 comprises four resistors $R_1$-$R_4$, and four reactive components of a first kind, in this case four capacitors $C_1$-$C_4$. The resistors and the reactive components of the first kind are connected in series to each other, serially "interleaved" so that a resistor is connected serially to a reactive component of the first kind which is connected serially to a resistor, etc. The first kind of reactive component can be either capacitors or inductors.

As can be seen in FIG. 6, each of the four output signals $V_{out1}$ to $V_{out4}$ of the six-port circuit 600 is accessed at a point between a reactive component of the first kind and a resistor. Thus, $V_{out1}$ is accessed between $R_1$ and $C_1$, $V_{out2}$ is accessed between $R_2$ and $C_2$, $V_{out3}$ is accessed between $R_3$ and $C_3$, and $V_{out4}$ is accessed between $R_4$ and $C_4$.

In addition, the serially connected resistors and reactive components of the polyphase filter 605 are connected in a "loop": if we consider all of the serially connected resistors and reactive components in the filter 605, it can be seen that the "last" component, in this case the reactive component denoted as $C_4$, is connected in series to the "first" component, in this case the resistor $R_1$, thus forming a loop.

The first input port $V'_{in1}$ of the polyphase filter 605 is at a point between the "first" and the "last" component in the loop, i.e. between the components denoted as $R_1$ and $C_4$ in FIG. 6. The second input port $V'_{in2}$ of the polyphase filter 605 is at a point between the second of the reactive components, i.e. $C_2$, and the third resistor, i.e. $R_3$. As shown in FIG. 6, the balun 110 and the power splitter 120 are connected in the same manner as in the generic example of the six-port circuit shown in FIG. 1.

Figure 7:
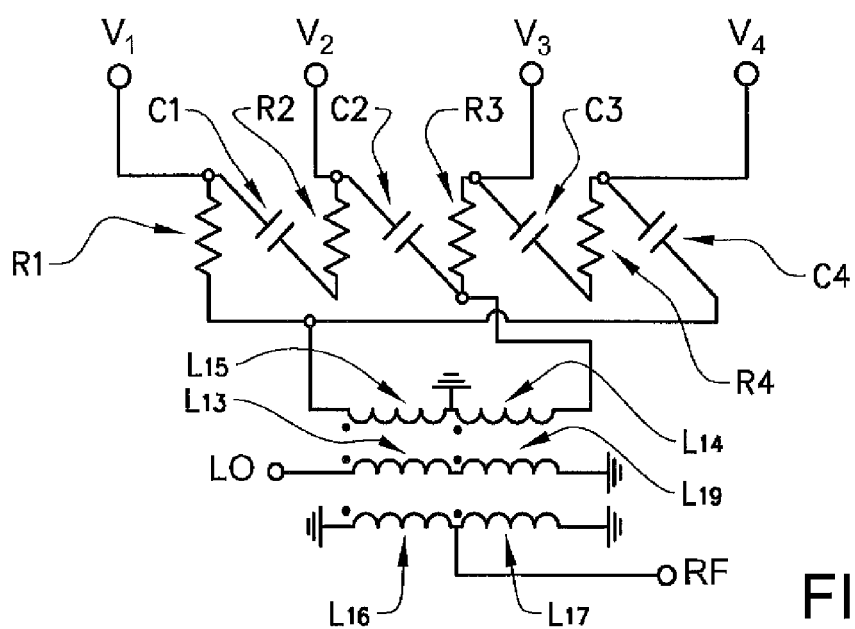
FIG. 7 shows the six-port circuit of FIG. 6 using the balun of FIG. 4a and the power splitter of FIG. 4b.

FIG. 7 shows the balun and the power splitter of FIGS. 4a and 4b used with a polyphase filter.

In the drawings and specification, there have been disclosed exemplary embodiments of the invention. However, many variations and modifications can be made to these embodiments without substantially departing from the principles of the present invention. Accordingly, although specific terms are employed, they are used in a generic and descriptive sense only and not for purposes of limitation.

The invention is not limited to the examples of embodiments described above and shown in the drawings, but may be freely varied within the scope of the appended claims.

The invention claimed is:

1. A six-port circuit with first ($V_{in1}$) and second ($V_{in2}$) input ports and four output ports ($V_{out1}$, $V_{out2}$, $V_{out3}$, $V_{out4}$), the six-port circuit comprising a balun including an unbalanced end connected to the first input port ($V_{in1}$) for converting a first input signal at the first input port into first and second balanced input signals; a filter including first ($V'_{in1}$) and second ($V'_{in2}$) input ports ($V'_{in1}$, $V'_{in2}$) and four output ports which constitute the four output ports ($V_{out1}$, $V_{out2}$, $V_{out3}$, $V_{out4}$) of the six-port circuit; and a power splitter connected to the second input port ($V_{in2}$) for splitting a second input signal at the second input port into a first and a second part of the second input signals, wherein the two input ports ($V'_{in1}$, $V'_{in2}$) of the filter are connected so that one of the balanced input signals and one of the parts of the second input signals are connected to one of the filter's input ports ($V'_{in1}$), and the other of the balanced input signals and the other of the parts of the second input signals are connected to the other of the filter's input ports ($V'_{in2}$).

2. The six-port circuit of claim 1, wherein the filter is a quadrature all-pass filter, wherein a first ($V_{OUT1}$) and a second ($V_{OUT2}$) of the filter's output ports are connected to each other by a resistor, and a third ($V_{OUT3}$) and a fourth ($V_{OUT4}$) of the filter's output ports are connected to each other by a resistor, and the first ($V_{OUT1}$) and fourth ($V_{OUT4}$) of the filter's output ports are connected to the filter's first ($V'_{in1}$) and second ($V'_{in2}$) input ports, respectively, by a first reactive component of a first kind, and the filter's first input port ($V'_{in1}$) is connected to the filter's third output port ($V_{OUT3}$) by a first component of a second reactive kind, and the filter's second input port ($V'_{in2}$) is connected to the filter's second output port ($V_{OUT2}$) by a second reactive component of the second kind.

3. The six-port circuit of claim 1, wherein the reactive components of the first and second kind are configured as either capacitors or inductors and as different kinds of reactive components.

4. The six-port circuit of claim 1, wherein the filter is a polyphase filter which comprises four resistors and four reactive components of a first kind, wherein the resistors and reactive components of the first kind are connected in series to each other so that a resistor is connected serially to a reactive component of the first kind, and wherein each of the four output ports is accessed at a point between a serially connected resistor and a reactive component of the first kinds, and the serially connected components of the polyphase filter are serially connected in a loop, with the first input port ($V'_{in1}$) of the polyphase filter being at a point between the first and the last component in the loop, and with the second input port ($V'_{in2}$) of the polyphase filter being at a point between the second component ($C_2$) of the first reactive kind and the third resistor ($R_3$).

5. The six-port circuit of claim 1, wherein the balun and the power splitter are implemented as coupled inductors.

* * * * *